(12) United States Patent
Gstrein et al.

(10) Patent No.: US 9,754,778 B2
(45) Date of Patent: Sep. 5, 2017

(54) METALLIZATION OF FLUOROCARBON-BASED DIELECTRIC FOR INTERCONNECTS

(71) Applicant: Intel Corporation, Santa Clara, CA (US)

(72) Inventors: Florian Gstrein, Portland, OR (US); David J. Michalak, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/731,324

(22) Filed: Jun. 4, 2015

(65) Prior Publication Data

US 2015/0270117 A1    Sep. 24, 2015

Related U.S. Application Data

(62) Division of application No. 12/560,936, filed on Jul. 27, 2012, now Pat. No. 9,111,939.

(51) Int. Cl.
*H01L 21/00* (2006.01)
*H01L 21/02* (2006.01)
(Continued)

(52) U.S. Cl.
CPC .......... *H01L 21/0212* (2013.01); *G06F 1/16* (2013.01); *H01L 21/02274* (2013.01); *H01L 21/02282* (2013.01); *H01L 21/3212* (2013.01); *H01L 21/52* (2013.01); *H01L 21/76802* (2013.01); *H01L 21/76829* (2013.01); *H01L 21/76879* (2013.01); *H01L 23/5226* (2013.01); *H01L 23/5329* (2013.01); *H01L 23/53209* (2013.01); *H01L 23/53238* (2013.01); *H01L 23/53242* (2013.01); *H01L 23/53257* (2013.01); *H01L 23/53295* (2013.01); *H01L 2924/0002* (2013.01)

(58) Field of Classification Search
CPC   H01L 21/0212; H01L 21/52; H01L 21/02282
See application file for complete search history.

(56) References Cited

U.S. PATENT DOCUMENTS 6,686,293 B2 * 2/2004 Kim .................. H01L 21/02063
216/79
7,169,701 B2 * 1/2007 Yeh ..................... H01L 21/76801
257/E21.024

(Continued)

*Primary Examiner* — Laura Menz
(74) *Attorney, Agent, or Firm* — Schwabe, Williamson & Wyatt, P.C.

(57) ABSTRACT

Embodiments of the present disclosure are directed towards metallization of a fluorocarbon-based dielectric material for interconnect applications. In one embodiment, an apparatus includes a semiconductor substrate, a device layer disposed on the semiconductor substrate, the device layer including one or more transistor devices, and an interconnect layer disposed on the device layer, the interconnect layer comprising a fluorocarbon-based dielectric material, where x represents a stoichiometric quantity of fluorine relative to carbon in the dielectric material, and one or more interconnect structures configured to route electrical signals to or from the one or more transistor devices, the one or more interconnect structures comprising cobalt (Co), or ruthenium (Ru), or combinations thereof. Other embodiments may be described and/or claimed.

10 Claims, 4 Drawing Sheets

(51) Int. Cl.
*H01L 23/532* (2006.01)
*G06F 1/16* (2006.01)
*H01L 21/321* (2006.01)
*H01L 21/52* (2006.01)
*H01L 21/768* (2006.01)
*H01L 23/522* (2006.01)

(56) References Cited

U.S. PATENT DOCUMENTS

| | | | |
|---|---|---|---|
| 7,439,171 B2 * | 10/2008 | Soda | H01L 21/76808 257/E21.579 |
| 7,470,617 B2 | 12/2008 | Chebiam et al. | |
| 8,653,662 B2 | 2/2014 | LaCroix et al. | |
| 8,786,058 B2 | 7/2014 | Han et al. | |
| 9,111,939 B2 * | 8/2015 | Gstrein | H01L 23/53238 |
| 2005/0035460 A1 | 2/2005 | Tseng | |
| 2006/0003576 A1 * | 1/2006 | Yeh | H01L 21/76801 438/638 |
| 2006/0094234 A1 * | 5/2006 | Soda | H01L 21/76808 438/638 |
| 2007/0141826 A1 * | 6/2007 | Chowdhury | H01L 21/288 438/618 |
| 2008/0296768 A1 | 12/2008 | Chebiam et al. | |
| 2009/0065946 A1 | 3/2009 | Kojima | |
| 2010/0155932 A1 | 6/2010 | Gambino et al. | |
| 2010/0244252 A1 * | 9/2010 | Jezewski | H01L 21/76846 257/751 |
| 2010/0252934 A1 | 10/2010 | Law et al. | |
| 2011/0318919 A1 * | 12/2011 | Horigome | H01L 21/02115 438/653 |
| 2012/0112361 A1 | 5/2012 | Han et al. | |
| 2013/0175701 A1 | 7/2013 | Park et al. | |
| 2013/0270676 A1 | 10/2013 | Lindert et al. | |
| 2013/0270703 A1 | 10/2013 | Zierath et al. | |
| 2013/0271938 A1 | 10/2013 | Lindert et al. | |
| 2014/0027909 A1 * | 1/2014 | Gstrein | H01L 21/76802 257/751 |
| 2014/0029181 A1 | 1/2014 | Gstrein et al. | |
| 2015/0270117 A1 * | 9/2015 | Gstrein | H01L 21/76802 361/679.02 |

* cited by examiner

METALLIZATION OF FLUOROCARBON-BASED DIELECTRIC FOR INTERCONNECTS

CROSS-REFERENCE TO RELATED APPLICATION

This application is a divisional of U.S. patent application Ser. No. 13/560,936, filed Jul. 27, 2012 and titled "METALLIZATION OF FLUOROCARBON-BASED DIELECTRIC FOR INTERCONNECTS," the entirety of which is incorporated herein by reference.

FIELD

Embodiments of the present disclosure generally relate to the field of integrated circuits, and more particularly, to metallization of a fluorocarbon-based dielectric material for interconnect applications.

BACKGROUND

An integrated circuit (IC) device may include an interlayer dielectric (ILD) stack having interconnect structures formed in a dielectric material to route electrical signals of the IC device. Careful selection of materials used for the dielectric materials and interconnects of an ILD stack may facilitate formation and function of an IC device that includes such an ILD stack.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
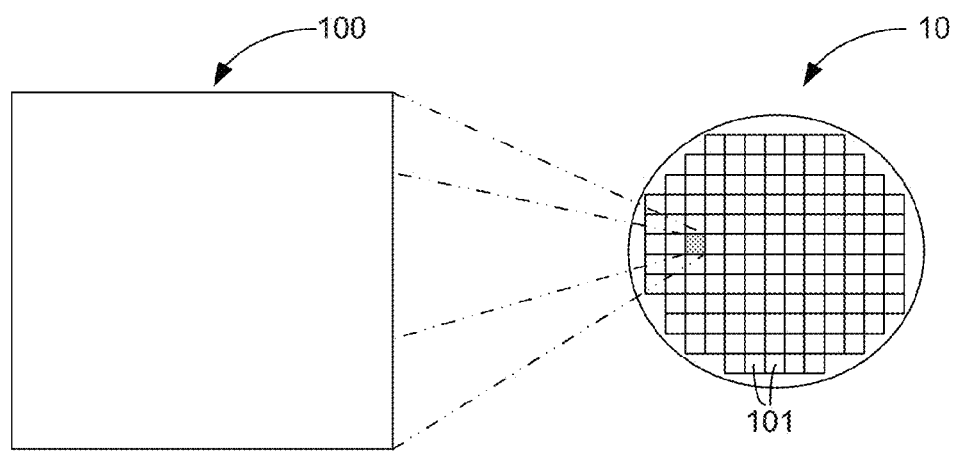
FIG. 1 schematically illustrates a top view of an integrated circuit (IC) device in die form and wafer form, in accordance with some embodiments.

Fluorocarbon-based dielectric materials are emerging as a class of dielectric materials that may have a lower polarizability than other dielectric materials used for ILD applications such as, for example, carbon-doped oxide (CDO) dielectric materials. The lower polarizability may allow the fluorocarbon-based dielectric material to provide a lower dielectric constant (k) at a given porosity relative to the other dielectric materials.

However, a current challenge with fluorocarbon-based dielectric materials is that fluorine-based compounds such as, for example, fluorocarbons ($CF_n$) and hydrogen fluoride (HF) may outgas during elevated temperatures associated with backend thermal processing. The emitted fluorine-based compounds may be highly reactive and form volatile compounds with current interconnect materials that may lead to failure of an interlayer dielectric (ILD) stack. For example, tantalum nitride (TaN) in the presence of the fluorine-based compounds may form the volatile compound tantalum fluoride (TaF), which may melt and/or boil at backend processing temperatures.

Embodiments of the present disclosure describe metallization of a fluorocarbon-based dielectric material for interconnect applications. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations are described as multiple discrete operations in turn, in a manner that is most helpful in understanding the claimed subject matter. However, the order of description should not be construed as to imply that these operations are necessarily order dependent.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or elements are in direct contact.

In various embodiments, the phrase "a first layer formed, deposited, or otherwise disposed on a second layer," may mean that the first layer is formed, deposited, or disposed over the second layer, and at least a part of the first layer may be in direct contact (e.g., direct physical and/or electrical contact) or indirect contact (e.g., having one or more other layers between the first layer and the second layer) with at least a part of the second layer.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a top view of an IC device 100 in die form and wafer form, in accordance with some embodiments. In some embodiments, the IC device 100 may be one of a plurality of IC devices formed on a wafer 10 composed of semiconductor material. The wafer 10 may include one or more dies (hereinafter "dies 101") formed on a surface of the wafer 10. Each of the dies 101 may be a repeating unit of a semiconductor product that includes the IC device 100. After a fabrication process of the semiconductor product is complete, the wafer 10 may undergo a singulation process in which each of the dies 101 is separated from one another to provide discrete "chips" of the semiconductor product. The wafer 10 may include a variety of sizes. In some embodiments, the wafer 10 has a diameter ranging from about 25.4 mm to about 450 mm. The wafer 10 may include other sizes and/or other shapes in other embodiments.

According to various embodiments, the IC device 100 may be in wafer 10 form (e.g., not singulated) or die form (e.g., singulated). In some embodiments, the IC device 100 may correspond with or be part of a die of the dies 101. In FIG. 1, one of the dies 101 (shaded in wafer 10) including the IC device 100 is depicted in an exploded view. The IC device 100 may include one or more transistors (e.g., transistor(s) 140 of FIG. 2) and/or supporting circuitry to route electrical signals to the one or more transistors.

In some embodiments, the IC device 100 can include memory and/or logic devices combined on a single die. For example, a memory device may be formed on a same die 101 as a processor (e.g., processor 1004 of FIG. 8) or other logic that is configured to store information in the memory device or execute instructions of the memory device. For example, the IC device 100 may include a processor and cache formed on the same die in some embodiments. Techniques and configurations described herein may be incorporated in logic or memory, or combinations thereof.

Figure 2:
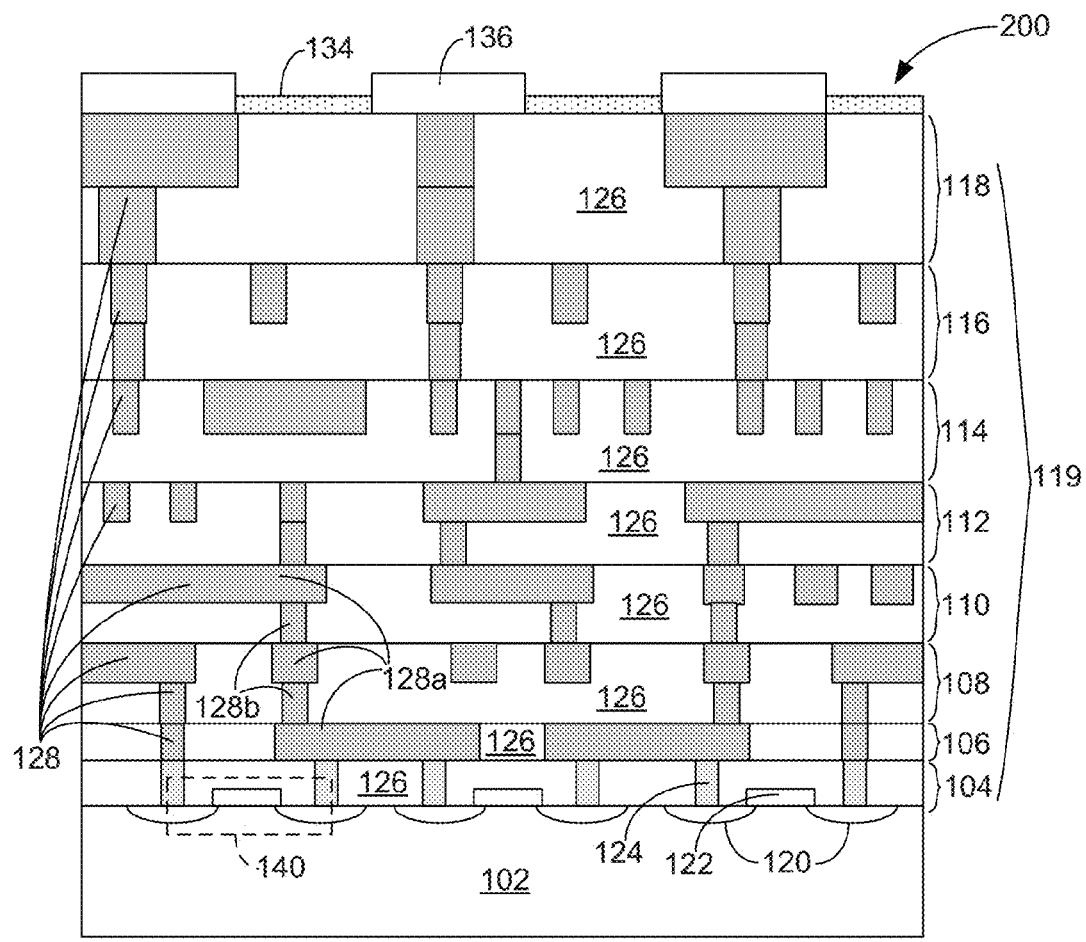
FIG. 2 schematically illustrates a cross-section side view of an IC device, in accordance with some embodiments.

FIG. 2 schematically illustrates a cross-section side view of an IC device 200, in accordance with some embodiments. According to various embodiments, the IC device 200 is formed on a substrate 102 (e.g., wafer 10 of FIG. 1). The substrate 102 may be a semiconductor substrate composed of semiconductor material systems including, for example, N-type or P-type materials systems. The substrate 102 may include, for example, a crystalline substrate formed using a bulk silicon or a silicon-on-insulator substructure. In some embodiments, the semiconductor substrate 102 may be formed using alternate materials, which may or may not be combined with silicon, that include but are not limited to germanium, indium antimonide, lead telluride, indium arsenide, indium phosphide, gallium arsenide, or gallium antimonide. Further materials classified as group II-VI, III-V or group IV materials may also be used to form the substrate 102. Although a few examples of materials from which the substrate 102 may be formed are described here, any material that may serve as a foundation upon which an IC device 200 may be used in accordance with various embodiments. In some embodiments, the substrate 102 is part of a singulated die (e.g., dies 101 of FIG. 1) of a wafer (e.g., wafer 10 of FIG. 1).

In some embodiments, the IC device 200 includes one or more device layers (hereinafter "device layer 104") disposed on the substrate 102. The device layer 104 may include features of one or more transistors (hereinafter "transistor(s) 140") formed on the substrate 102. The device layer 104 may include, for example, one or more source and/or drain regions (hereinafter "S/D regions") 120, a gate 122 to control current flow in the transistor(s) 140 between the S/D regions 120, and one or more source and/or drain contacts (hereinafter "S/D contacts 124") to route electrical signals to/from the S/D regions 120.

The transistor(s) 140 may include additional features not depicted for the sake of clarity such as device isolation regions, gate contacts, and the like. The transistor(s) 140 are not limited to the type and configuration depicted in FIG. 2 and may include a wide variety of other types and configurations such as, for example, planar and non-planar transistors such as dual- or double-gate transistors, tri-gate transistors, and all-around gate (AAG) or wrap-around gate transistors, some of which may be referred to as FinFETs (Field Effect Transistors). In some embodiments, the device layer 104 includes one or more transistors or memory cells of a logic device or a memory device, or combinations thereof.

Electrical signals such as, for example, power and/or input/output (I/O) signals may be routed to and/or from the transistor(s) 140 of the device layer 104 through one or more interconnect layers (e.g., hereinafter "interconnect layers 106-118") disposed on the device layer 104. For example, electrically conductive features of the device layer 104 such as, for example, the gate 122 and S/D contacts 124 may be electrically coupled with interconnect structures 128 of the interconnect layers 106-118. The one or more interconnect layers 106-118 may form an interlayer dielectric (ILD) stack 119 of the IC device 200.

The interconnect structures 128 may be configured within the interconnect layers 106-118 to route electrical signals according to a wide variety of designs and is not limited to the particular configuration of interconnect structures 128 depicted in the figures. Although a particular number of interconnect layers 106-118 is depicted for the configuration in FIG. 2, embodiments of the present disclosure include IC devices having more or fewer interconnect layers 106-118 than depicted.

In some embodiments, the interconnect structures 128 may include trench structures 128a (sometimes referred to as "lines") and/or via structures 128b (sometimes referred to as "holes") filled with an electrically conductive material such as a metal. In some embodiments, the interconnect structures 128 may comprise cobalt (Co), or ruthenium (Ru), or combinations thereof. The interconnect structures 128 may comport with embodiments described in connection with interconnect structures 328 of FIG. 3, interconnect structures 428 of FIG. 4, interconnect structure 528 of FIG. 5, interconnect structure 628 of FIG. 6, or combinations thereof.

In some embodiments, the trench structures 128a may be configured to route electrical signals in a direction of a plane that is substantially parallel with a surface of the substrate 102 upon which the device layer 104 is formed. For example, the trench structures 128a may route electrical signals in a direction in and out of the page in the perspective of FIG. 2, in some embodiments. The via structures 128b may be configured to route electrical signals in a direction of a plane that is substantially perpendicular with the surface of the substrate 102 upon which the device layer 104 is formed. In some embodiments, the via structures 128b may electrically couple trench structures 128a of different interconnect layers 106-118 together.

The interconnect layers 106-118 may include a dielectric material 126 disposed between the interconnect structures 128, as can be seen. In some embodiments, the dielectric material 126 may include a fluorocarbon-based dielectric material (e.g., $CF_x$). According to various embodiments, the fluorocarbon-based dielectric material may have a compositional range from 40% to 60% fluorine (F) and 40% to 60% carbon (C). The fluorocarbon-based dielectric material may have other stoichiometric ratios in other embodiments.

According to various embodiments, a first interconnect layer 106 (referred to as Metal 1 or "M1") may be formed directly on the device layer 104. In some embodiments, the first interconnect layer 106 may include trench structures 128a, as can be seen. The trench structures 128a of the first interconnect layer 106 may be coupled with contacts (e.g., S/D contacts 124) of the device layer 104.

A second interconnect layer 108 (referred to as Metal 2 or "M2") may be formed directly on the first interconnect layer 106. In some embodiments, the second interconnect layer 108 may include via structures 128b to couple trench structures 128a of the second interconnect layer 108 with trench structures 128a of the first interconnect layer 106. Although the trench structures 128a and the via structures 128b are structurally delineated with a line within each interconnect layer (e.g., within the second interconnect layer 108) for the sake of clarity, the trench structures 128a and the via structures 128b may be structurally and/or materially contiguous (e.g., simultaneously filled during a dual-damascene process) in some embodiments.

A third interconnect layer 110 (referred to as Metal 3 or "M3"), fourth interconnect layer 112 (referred to as Metal 4 or "M4"), fifth interconnect layer 114 (referred to as Metal 5 or "M5"), sixth interconnect layer 116 (referred to as Metal 6 or "M6"), and seventh interconnect layer 118 (referred to as Metal 7 or "M7") may be formed in succession on the second interconnect layer 108 according to similar techniques and configurations described in connection with the second interconnect layer 108 on the first interconnect layer 106.

In some embodiments, the dielectric material 126 used to form inner interconnect layers (e.g., M1-M2, M1-M3, M1-M4) disposed adjacent to the device layer 104 may be composed of a fluorocarbon-based dielectric material while outer interconnect layers disposed further away from the device layer 104 may be composed of another dielectric material such as, for example, carbon-doped silicon oxide (e.g., SiOC). The inner interconnect layers may include, for example, M1 to M2, M1 to M3, or M1 to M4. The outer interconnect layers may include, for example, M3 to M7, M4 to M7, or M5 to M7, where M7 represents an outermost interconnect layer relative to the device layer 104. Inner interconnect layers may have a lower capacitance than the outer interconnect layers.

In some embodiments, features of the device layer 104 may comport with embodiments described herein. For example, contacts in the device layer 104 such as, for example, S/D contacts 124 may include material configurations described in connection with interconnect structures 328, 428, 528, or 628 of respective FIGS. 3-6. The same principles may be applied to gate contacts (not shown) of the device layer 104. In some embodiments, any one or more of the interconnect layers 106-118 may include interconnect structures 128 that comport with embodiments described in connection with interconnect structures 328, 428, 528, or 628 of respective FIGS. 3-6.

The IC device 200 may include a passivation layer 134 (e.g., polyimide or similar material) and one or more bond pads 136 formed on the interconnect layers 106-118. The bond pads 136 may be electrically coupled with the interconnect structures 128 and configured to route the electrical signals of transistor(s) 140 to other external devices. For example, solder bonds may be formed on the one or more bond pads 136 to mechanically and/or electrically couple a chip including the IC device 200 with another component such as a circuit board. The IC device 200 may have other alternative configurations to route the electrical signals from the interconnect layers 106-118 than depicted in other embodiments. In other embodiments, the bond pads 136 may be replaced by or may further include other analogous features (e.g., posts) that route the electrical signals to other external components.

Figure 3:
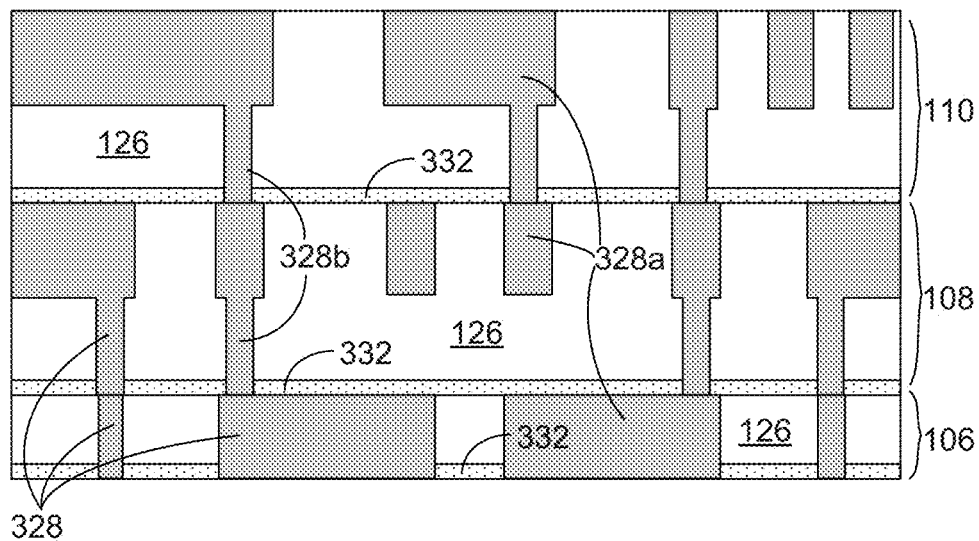
FIG. 3 schematically illustrates an example cross-section side view of interconnect layers of an IC device, in accordance with some embodiments.

FIG. 3 schematically illustrates an example cross-section side view of interconnect layers 106-110 of an IC device (e.g., IC device 200 of FIG. 2), in accordance with some embodiments. The interconnect layers 106-110 may include interconnect structures 328 such as, for example, trench structures 328a and/or via structures 328b, as can be seen.

In some embodiments, one or more of the interconnect layers 106-110 may include interconnect structures 328 that are composed primarily of Co, or Ru, or combinations thereof. In some embodiments, the interconnect structures 328 may be single-phase interconnects that are composed only of Co, or Ru, or combinations thereof.

Interconnect structures 328 that are primarily or solely composed of Co, or Ru, or combinations thereof may reduce fabrication costs of an IC device by allowing or facilitating the elimination of various process operations and/or materials (e.g., fabrication of barrier liner). In some embodiments, the interconnect structures 328 do not include a barrier liner. The material (e.g., the Co or Ru) of the interconnect structures 328 may be in direct contact with the dielectric material 126. The dielectric material 126 used in connection with the interconnect structures 328 may include a fluorocarbon-based dielectric material in some embodiments. The Co and/or Ru of the interconnect structures 328 may resist formation of volatile compounds in the presence of fluorine-based compounds that may outgas or otherwise be emitted from the dielectric material 126 during thermal processes associated with fabrication of an IC device. In some embodiments, any of one or more of the interconnect layers (e.g., interconnect layers 106-118 of FIG. 2) of an IC device may include interconnect structures 328 in accordance with embodiments described herein.

In some embodiments, an isolation film 332 may be disposed between dielectric material 126 of adjacent interconnect layers (e.g., interconnect layers 106, 108). The isolation film 332 may serve as a hermetic barrier between interconnect layers, as can be seen, to prevent oxidation and/or other corrosion of the interconnect structures 328. The isolation film 332 may be composed of another dielectric material that has a chemical composition that is different than the dielectric material 126. In some embodiments, the isolation film 332 may be composed of silicon nitride (SiN) or silicon carbide (SiC). The isolation film 332 may be disposed between the dielectric material 126 of an interconnect layer (e.g., interconnect layer 108) and the device layer (e.g., device layer 104 of FIG. 2) in some embodiments.

Figure 4:
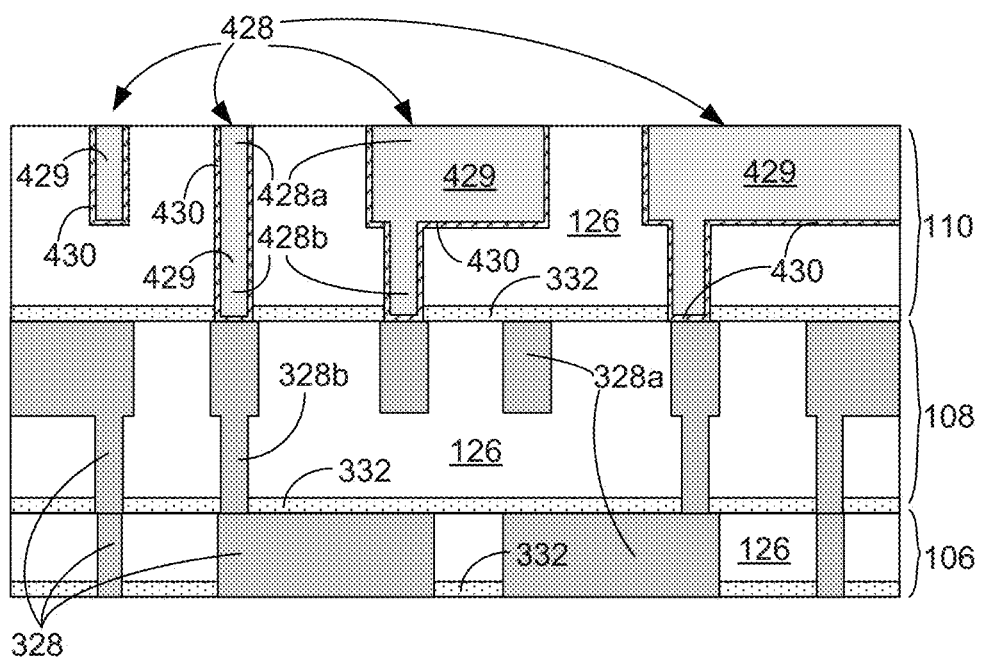
FIG. 4 schematically illustrates another example cross-section side view of interconnect layers of an IC device, in accordance with some embodiments.

FIG. 4 schematically illustrates another example cross-section side view of interconnect layers 106-110 of an IC device (e.g., IC device 200 of FIG. 2), in accordance with some embodiments. The interconnect layers 106-108 may include interconnect structures 328 such as, for example, trench structures 328a and/or via structures 328b, as can be seen. The interconnect layer 110 may include interconnect structures 428 such as, for example, trench structures 428a and/or via structures 428b, as can be seen. The interconnect structures 428 are not limited to the particular configuration depicted in FIG. 4. Furthermore, other suitable combinations of the interconnect structures 328 and 428 than depicted may be used in other embodiments.

In some embodiments, one or more of the interconnect layers (e.g., interconnect layer 110 in FIG. 4) may include interconnect structures 428 that include a bulk portion 429 and a barrier liner 430. In some embodiments, the bulk portion 429 (e.g., a majority of the interconnect structure) is composed of copper (Cu) and the barrier liner 430 includes Co, or Ru, or combinations thereof. The interconnect structures 428 may comport with embodiments described in connection with interconnect structures 528 and 628 of respective FIGS. 5-6 in some embodiments.

The dielectric material 126 used in connection with the interconnect structures 428 may include a fluorocarbon-based dielectric material in some embodiments. The Co and/or Ru of the interconnect structures 428 may resist formation of volatile compounds in the presence of fluorine-based compounds that may outgas or otherwise be emitted from the dielectric material 126 during thermal processes associated with fabrication of an IC device. In some embodiments, any of one or more of the interconnect layers (e.g., interconnect layers 106-118 of FIG. 2) of an IC device may include interconnect structures 428 in accordance with embodiments described herein.

In some embodiments, an isolation film 332 may be disposed between dielectric material 126 of adjacent interconnect layers (e.g., interconnect layers 106, 108). The isolation film 332 may serve as a hermetic barrier between interconnect layers to prevent oxidation and/or other corrosion of the interconnect structures 428.

Figure 5:
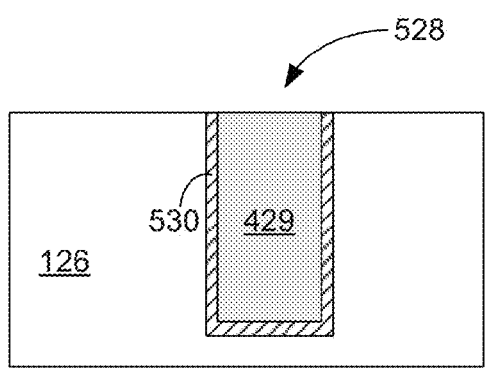
FIG. 5 schematically illustrates an interconnect structure having a barrier liner, in accordance with some embodiments.

FIG. 5 schematically illustrates an interconnect structure 528 having a barrier liner 530, in accordance with some embodiments. The barrier liner 530 may be disposed between a bulk portion 429 (e.g., Cu) of the interconnect structure 528 and dielectric material 126 (e.g., $CF_x$) of an interconnect layer. The interconnect structure 528 may represent any interconnect structure of an IC device including, for example, trench structures (e.g., trench structures 128a of FIG. 2) and/or via structures (e.g., via structures 128b of FIG. 2).

In some embodiments, the barrier liner 530 may be composed (e.g., primarily or solely) of Co, or Ru, or combinations thereof. In other embodiments, the barrier liner 530 may be composed of Co, or Ru, in combination with other materials such as, for example, titanium nitride (TiN). For example, in some embodiments, the barrier liner 530 may include a film composed of TiN doped with Co, or Ru, or combinations thereof. The barrier liner 530 may include a film of TiN having a sidewall thickness ranging from 2 nanometers (nm) to 3 nm and a bottom thickness ranging from 5 nm to 10 nm or more. Films composed of Co and/or Ru may be conformal films deposited by CVD and having sidewall and bottom thickness that are substantially the same. The barrier liner 530 may include additional films or have other thicknesses in some embodiments.

Figure 6:
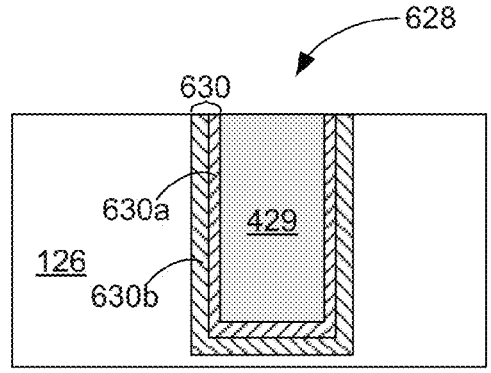
FIG. 6 schematically illustrates another interconnect structure having a barrier liner, in accordance with some embodiments.

FIG. 6 schematically illustrates another interconnect structure 628 having a barrier liner 630, in accordance with some embodiments. The barrier liner 630 may be disposed between a bulk portion 429 (e.g., Cu) of the interconnect structure 628 and dielectric material 126 (e.g., $CF_x$) of an interconnect layer. The interconnect structure 628 may represent any interconnect structure of an IC device including, for example, trench structures (e.g., trench structures 128a of FIG. 2) and/or via structures (e.g., via structures 128b of FIG. 2).

In some embodiments, the barrier liner 630 may include a first film 630a coupled with the bulk portion 429 and a second film 630b coupled with the first film 630a, as can be seen. The first film 630a may be composed (e.g., primarily or solely) of Co, or Ru, or combinations thereof. The second film 630b may be composed of TiN. In other embodiments, the first film 630a may be composed of TiN and the second film 630b may be composed of Co, or Ru, or combinations thereof. In some embodiments, the TiN may serve as a nucleation layer for subsequent Co or Ru deposition. Cu may have a better adhesion to Co and Ru than to TiN. The use of Co or Ru alone may not prevent diffusion of Cu and the use of TiN may provide a diffusion barrier in some embodiments.

Figure 7:
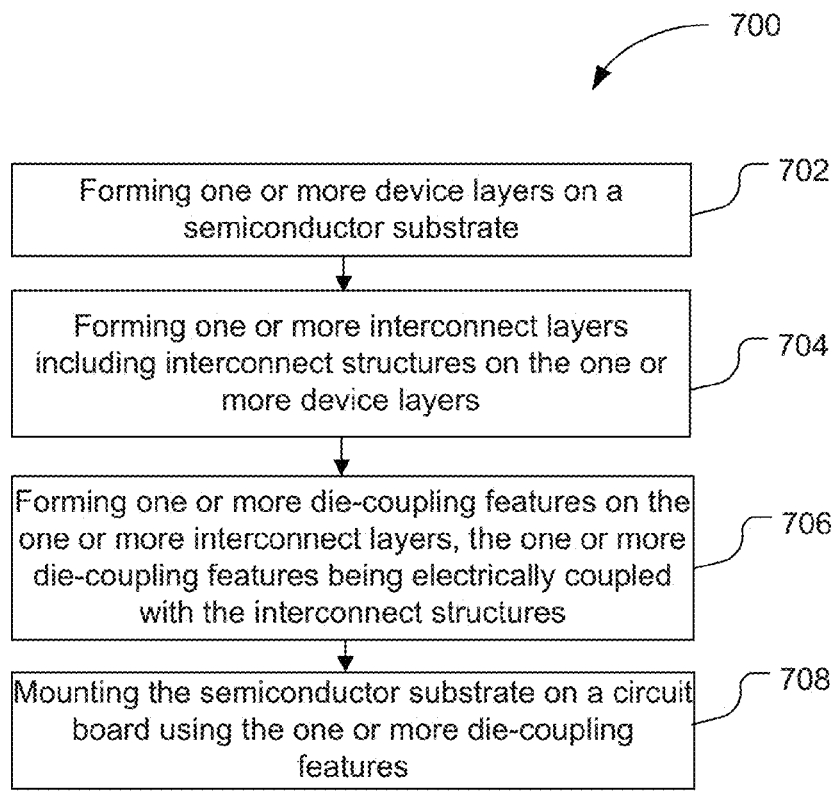
FIG. 7 is a flow diagram for a method of fabricating and packaging an IC device, in accordance with some embodiments.

FIG. 7 is a flow diagram for a method 700 of fabricating and packaging an IC device (e.g., IC device 200 of FIG. 2), in accordance with some embodiments. The method may comport with embodiments described in connection with FIGS. 1-6.

At 702, the method 700 includes forming one or more device layers (e.g., device layer 104 of FIG. 2) on a semiconductor substrate (e.g., substrate 102 of FIG. 2). The one or more device layers may be formed using semiconductor fabrication processes such as thin film deposition of various materials and patterning (e.g., etch and/or lithography) of the materials to form one or more transistors (e.g., transistor(s) 140 of FIG. 2) of the IC device. The IC device may include, for example, a logic device, a memory device, or combinations thereof.

At 704, the method 700 may further include forming one or more interconnect layers (e.g., interconnect layers 106-118 of FIG. 2) including interconnect structures (e.g., interconnect structures 128 of FIG. 2) on the one or more device layers. The one or more interconnect layers may include a dielectric material (e.g., dielectric material 126 of FIG. 2) and interconnect structures configured to route electrical signals to or from the one or more transistor devices of the one or more device layers. In some embodiments, the dielectric material comprises a fluorocarbon-based dielectric material (e.g., $CF_x$) and the interconnect structures comprise Co, or Ru, or combinations thereof.

The one or more interconnect layers may be formed by depositing a fluorocarbon-based dielectric material on the one or more device layers. The dielectric material may be deposited according to any suitable process including, fore example, plasma-enhanced chemical vapor deposition (PECVD) or a spin-on process.

The one or more interconnect layers may be further formed by selectively removing portions of the dielectric material to form openings (e.g., trench openings and/or via openings) in a dielectric layer that includes the dielectric material. In some embodiments, the dielectric material may be selectively removed by a patterning process including etch and/or lithography processes.

The one or more interconnect layers may be further formed by depositing Co and/or Ru into the openings to form at least a portion of the interconnect structures. In some embodiments, a dual-damascene process may be used to simultaneously form the interconnect structures (e.g., trench structures and via structures) of an individual interconnect layer of the interconnect layers. In some embodiments, the Co and/or Ru may be deposited to substantially or completely fill the openings to provide interconnect structures (e.g., interconnect structures 328) in accordance with embodiments described in connection with FIG. 3. The Co and/or Ru may be in direct contact with the dielectric material.

In other embodiments, forming the interconnect layer may further include forming a barrier liner (e.g., barrier liner 430 of FIG. 4) of the one or more interconnect structures. The barrier liner may be formed by depositing a barrier liner material onto surfaces of the dielectric material in the openings. In some embodiments, the barrier liner comprises Co and/or Ru. In some embodiments, the barrier liner may be substantially or entirely composed of Co and/or Ru. In some embodiments, the barrier liner may be formed by depositing a barrier liner material such as, for example, TiN doped with Co and/or Ru. In other embodiments, the barrier liner may be formed by depositing a first film (e.g., first film 630a of FIG. 6) on the dielectric material and a second film (e.g., second film 630b of FIG. 6) on the first film, the second film having a different chemical composition than the first film. The first film may include, for example, TiN or similar material and the second film may include, for example, Co and/or Ru. The first film and/or second film may have other suitable material compositions in other embodiments.

Forming the interconnect layer may further include forming a bulk portion of the one or more interconnect structures. The bulk portion may be formed by depositing a bulk material (e.g., Cu) on the barrier liner using any suitable deposition process including, for example, chemical vapor deposition (CVD) and/or electroplating processes.

Forming the one or more interconnect layers may further include performing a chemical mechanical polishing (CMP) process on the one or more interconnect structures and/or depositing an isolation film (e.g., isolation film 332 of FIG. 3) on the dielectric layer and one or more interconnect structures. The CMP process may provide a planar surface by removing excess interconnect structure material deposited into the openings. The isolation film may be formed by depositing another dielectric material (e.g., SiN or SiC) that has a chemical composition that is different than the dielectric material (e.g., $CF_x$) on the dielectric material. The actions described in connection with forming the one or more interconnect layers may be repeated to form additional interconnect layers and may begin with depositing the isolation film in some embodiments.

At 706, the method 700 may further include forming one or more die-coupling features (e.g., bond pads 136 of FIG. 2) on the one or more interconnect layers, the one or more die-coupling features being electrically coupled with the interconnect structures. The one or more die-coupling features may be formed by depositing and patterning an electrically conductive material such as metal.

At 708, the method 700 may further include mounting the semiconductor substrate on a circuit board (e.g., motherboard 1002 of FIG. 8) or other package substrate using the one or more die-coupling features. In some embodiments, the semiconductor substrate may be flip-chip mounted on the circuit board or mounted using any suitable surface mount technology (SMT).

According to various embodiments, using metallization schemes as described herein (e.g., using Co and/or Ru as an interconnect material for fluorocarbon-based dielectric material according to various embodiments) may reduce, inhibit, or otherwise prevent the formation of volatile compounds during backend thermal processing of the IC device that may otherwise form with other metallization schemes (e.g., tantalum).

Figure 8:
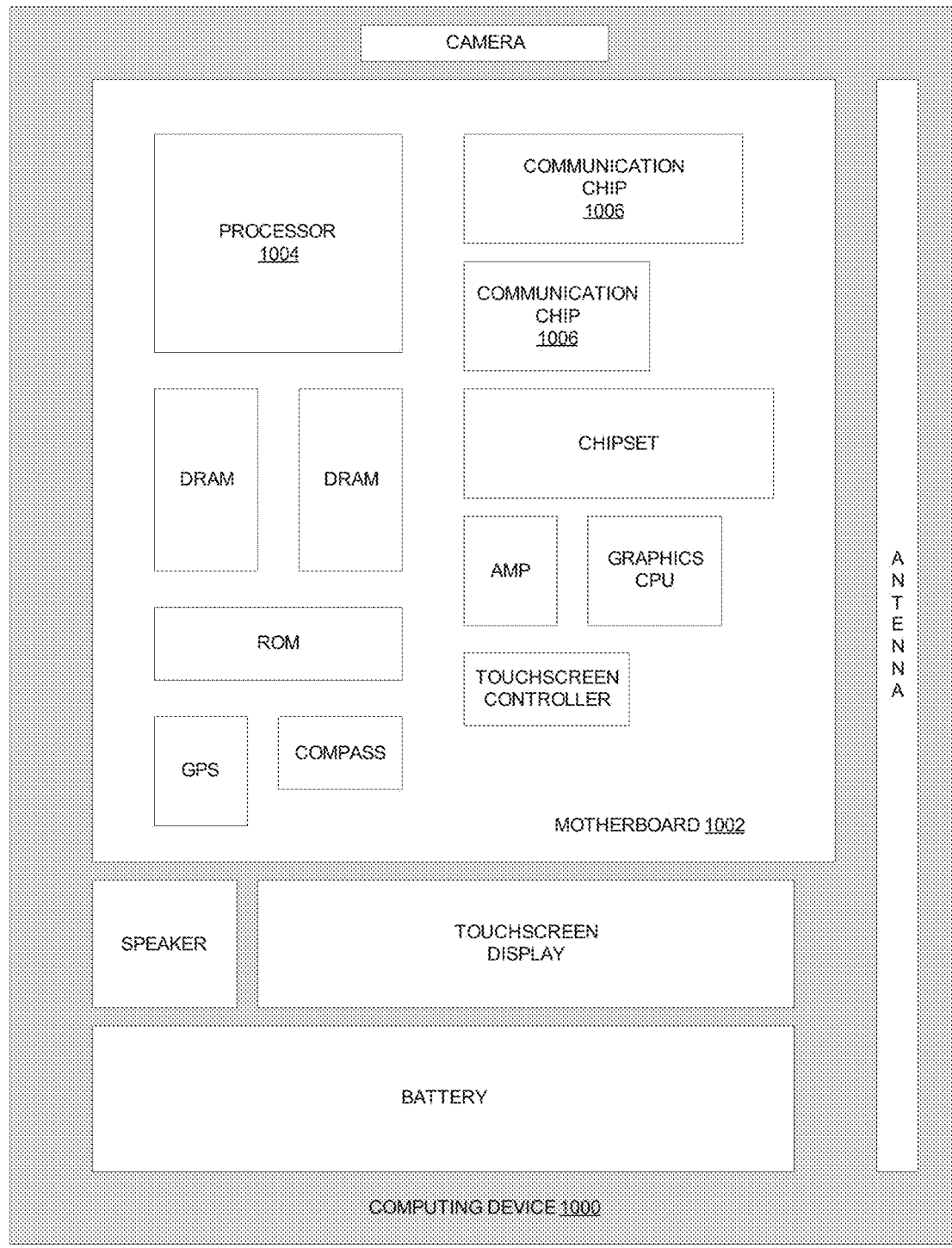
FIG. 8 schematically illustrates a computing device in accordance with one implementation of the invention.

Embodiments of the present disclosure may be implemented into a system using any suitable hardware and/or software to configure as desired. FIG. 8 schematically illustrates a computing device 1000 in accordance with one implementation of the invention. The computing device 1000 may house a board such as motherboard 1002. The motherboard 1002 may include a number of components, including but not limited to a processor 1004 and at least one communication chip 1006. The processor 1004 may be physically and electrically coupled to the motherboard 1002. In some implementations, the at least one communication chip 1006 may also be physically and electrically coupled to the motherboard 1002. In further implementations, the communication chip 1006 may be part of the processor 1004.

Depending on its applications, computing device 1000 may include other components that may or may not be physically and electrically coupled to the motherboard 1002. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 may include an integrated circuit die packaged within the processor 1004. In some implementations of the invention, the integrated circuit die (e.g., one of dies 101 of FIG. 1) of the processor 1004 comprises an IC device (e.g., IC device 200 of FIG. 2), as described herein. The term "processor" may refer to any device or portion of a device that processes electronic data from registers and/or memory to transform that electronic data into other electronic data that may be stored in registers and/or memory.

The communication chip 1006 may also include an integrated circuit die packaged within the communication chip 1006. In accordance with another implementation of the invention, the integrated circuit die of the communication chip includes an IC device (e.g., IC device 200 of FIG. 2), as described herein.

In further implementations, another component (e.g., memory device or other integrated circuit device) housed within the computing device 1000 may contain an integrated circuit die that includes an IC device (e.g., IC device 200 of FIG. 2), as described herein.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. An apparatus comprising:
   a semiconductor substrate;
   a device layer disposed on the semiconductor substrate, the device layer including one or more transistor devices; and
   an interconnect layer disposed on the device layer, the interconnect layer comprising:
      a fluorocarbon-based dielectric material, and
      one or more trench structures or via structures configured to route electrical signals to or from the one or more transistor devices, wherein a bulk portion of the one or more trench structures or via structures is composed of Co or Ru and the Co or Ru is in direct contact with the fluorocarbon-based dielectric material, wherein the one or more trench structures or via structures do not include a compound of Co or Ru with fluorine of the dielectric material.

2. The apparatus of claim 1, wherein the one or more trench structures or via structures of the interconnect layer is directly coupled with contacts of the device layer.

3. The apparatus of claim 1, wherein the interconnect layer further comprises an isolation film comprising another dielectric material that has a chemical composition that is different than the fluorocarbon-based dielectric material, wherein the isolation film is disposed between the fluorocarbon-based dielectric material and the device layer.

4. The apparatus of claim 1, wherein the fluorocarbon-based dielectric material has a compositional range from 40% to 60% fluorine (F).

5. The apparatus of claim 4, wherein the fluorocarbon-based dielectric material has a compositional range from 40% to 60% carbon (C).

6. The apparatus of claim 1, wherein the interconnect layer is a first interconnector layer and the apparatus further comprises:
   a second interconnect layer disposed on the first interconnect layer; and
   an isolation film disposed between the first and second interconnect layers.

7. The apparatus of claim 6, wherein the isolation film is composed of silicon nitride (SiN) or silicon carbide (SiC).

8. The apparatus of claim 1, wherein the one or more trench structures or via structures includes only Co, Ru, or a combination thereof.

9. The apparatus of claim 1, wherein the bulk portion of the one or more trench structures or via structures composed of Co or Ru is separated from a barrier liner and in direct contact with the barrier liner, and the barrier liner is in direct contact with the fluorocarbon-based dielectric material.

10. The apparatus of claim 1, wherein the bulk portion of the one or more trench structures or via structures composed of Co or Ru is without a barrier liner and is in direct contact with the fluorocarbon-based dielectric material.

* * * * *